US011001926B2

(12) United States Patent
Mann et al.

(10) Patent No.: US 11,001,926 B2
(45) Date of Patent: May 11, 2021

(54) APPARATUS AND METHOD FOR THE REDUCTION OF IMPURITIES IN FILMS

(71) Applicant: GALLIUM ENTERPRISES PTY LTD, Silverwater (AU)

(72) Inventors: Ian Mann, Curl Curl (AU); Satyanarayan Barik, Holroyd (AU); Marie Wintrebert-Fouquet, Glebe (AU); Josh Brown, Artarmon (AU); Paul Dunnigan, Stanhope Gardens (AU)

(73) Assignee: Gallium Enterprises Pty Ltd, New South Wales (AU)

( * ) Notice: Subject to any disclaimer, the term of this patent is extended or adjusted under 35 U.S.C. 154(b) by 0 days.

(21) Appl. No.: 15/111,673

(22) PCT Filed: Jan. 15, 2015

(86) PCT No.: PCT/AU2015/050013
§ 371 (c)(1),
(2) Date: Jul. 14, 2016

(87) PCT Pub. No.: WO2015/106318
PCT Pub. Date: Jul. 23, 2015

(65) Prior Publication Data
US 2016/0326649 A1    Nov. 10, 2016

(30) Foreign Application Priority Data

Jan. 15, 2014   (AU) .................. 2014900121

(51) Int. Cl.
*C23C 16/50*        (2006.01)
*H01J 37/32*        (2006.01)
(Continued)

(52) U.S. Cl.
CPC .............. *C23C 16/50* (2013.01); *C23C 16/34* (2013.01); *C23C 16/509* (2013.01);
(Continued)

(58) Field of Classification Search
CPC .......... H01J 37/32486; H01J 37/32504; H01J 37/322357; H01J 37/321; H01J 37/32477;
(Continued)

(56) References Cited

U.S. PATENT DOCUMENTS 5,698,168 A    12/1997  Priddy et al.
6,120,660 A     9/2000  Chu
(Continued)

FOREIGN PATENT DOCUMENTS

CN    103503579    2/2017
DE     19706556    8/1998
(Continued)

OTHER PUBLICATIONS

English Machine Translation of JP2013098172 retrieved from ESPACENET Jun. 28, 2018. (Year: 2013).*
(Continued)

*Primary Examiner* — Rakesh K Dhingra
*Assistant Examiner* — Laureen Chan
(74) *Attorney, Agent, or Firm* — Sheridan Ross P.C.

(57) ABSTRACT

A plasma generator is described which employs a partial PBN liner not only to minimise the loss of energetic gas species during film formation but also to reduce boron impurity levels introduced into the growing film relative to the use of a complete PBN liner. The use of such a plasma generator in a film forming apparatus and method of forming a film is also described.

20 Claims, 3 Drawing Sheets

(51) Int. Cl.
*C23C 16/509* (2006.01)
*C23C 16/34* (2006.01)

(52) U.S. Cl.
CPC ...... *H01J 37/321* (2013.01); *H01J 37/32357* (2013.01); *H01J 37/32477* (2013.01); *H01J 37/32486* (2013.01); *H01J 2237/3321* (2013.01)

(58) Field of Classification Search
CPC ............. H01J 2237/3321; C23C 16/50; C23C 16/509; C23C 16/34; H05H 1/26; H05H 1/46; H05H 2001/4645; H05H 2001/4652
See application file for complete search history.

(56) References Cited

U.S. PATENT DOCUMENTS

| | | | | |
|---|---|---|---|---|
| 6,592,707 | B2* | 7/2003 | Shih | C09D 4/00 118/715 |
| 2001/0047760 | A1* | 12/2001 | Moslehi | H01J 37/321 118/723 I |
| 2003/0013594 | A1* | 1/2003 | Nishimura | C03B 19/1025 501/32 |
| 2006/0124455 | A1* | 6/2006 | Song | C23C 14/0036 204/298.08 |
| 2006/0137610 | A1* | 6/2006 | Yoshizaki | C23C 16/325 118/723 E |
| 2006/0266291 | A1* | 11/2006 | Song | C23C 14/0036 118/723 I |
| 2007/0272299 | A1* | 11/2007 | Schuss | B01D 53/32 137/13 |
| 2008/0295872 | A1* | 12/2008 | Riker | H01J 37/32357 134/105 |
| 2011/0076401 | A1* | 3/2011 | Chao | C23C 16/325 427/249.16 |
| 2011/0186426 | A1* | 8/2011 | Hawrylchak | C23C 14/564 204/298.11 |
| 2012/0261390 | A1 | 10/2012 | Boulos et al. | |
| 2013/0220223 | A1 | 8/2013 | Hori | |
| 2014/0190635 | A1* | 7/2014 | Lee | H01J 37/321 156/345.48 |
| 2014/0197136 | A1* | 7/2014 | Nagorny | H05H 1/46 216/68 |

FOREIGN PATENT DOCUMENTS

| | | | | |
|---|---|---|---|---|
| GB | 1222243 | A * | 2/1971 | ........... A61B 18/042 |
| JP | H05-67570 | | 3/1993 | |
| JP | 2013098172 | A * | 5/2013 | |
| KR | 10-2006-0023982 | | 3/2006 | |
| KR | 10-2007-0081316 | | 8/2007 | |
| KR | 2013049364 | A | 5/2015 | |
| WO | WO 2006/034540 | A1 | 4/2006 | |
| WO | 2007075509 | A2 | 7/2007 | |

OTHER PUBLICATIONS

Ptak, Aaron Joseph, "Growth kinetics and doping of gallium nitride grown by rf-plasma assisted molecular beam epitaxy" (2001). retrieved from on Sep. 3, 2019 https://researchrepository.wvu.edu/cgi/viewcontent.cgi?article=2354&context=etd (Year: (Year: 2001).*

* cited by examiner

FIG 3

APPARATUS AND METHOD FOR THE REDUCTION OF IMPURITIES IN FILMS

This application is a national stage application under 35 U.S.C. § 371 of International Application No. PCT/AU2015/050013, filed Jan. 15, 2015, entitled "Apparatus and Method For The Reduction Of Impurities In Films," which claims priority to Australian Patent Application No. 2014900121, filed Jan. 15, 2014.

FIELD OF THE INVENTION

The present invention relates to an apparatus and method for the reduction of impurities, particularly boron, in films grown by CVD processes using a plasma.

BACKGROUND TO THE INVENTION

Any reference to background art herein is not to be construed as an admission that such art constitutes common general knowledge in Australia or elsewhere.

Metal containing films, such as gallium nitride (GaN) films, have applications in a range of devices from light emitting diodes (LEDs) to ultraviolet detectors to transistor devices.

These films have commonly been produced by techniques including molecular beam epitaxy (MBE), metal organic chemical vapour deposition (MOCVD) and remote plasma enhanced chemical vapour deposition (RPECVD or RPCVD). RPCVD has been employed to produce films of high quality at lower temperatures than MOCVD, which often involves growth temperatures of about 1000° C. to 1200° C., to thereby reduce equipment costs and allow the use of temperature sensitive preferred substrates for film deposition.

RPCVD uses the generation of plasma from a feed gas, such as nitrogen, to react with a metal organic reagent and deposit the desired material on the substrate. In this technique it is important to maintain a consistent level of suitably energetic active gas species which are supplied to the reaction or growth chamber from the plasma generation region being a plasma tube.

One pathway by which energetic active gas species can be diminished is through surface recombination on the walls of the plasma tube within which the plasma is generated and potentially also on the walls of the vessels transporting the active gas species to the growth chamber. This surface recombination is the recombination of atoms or molecules of, for example, nitrogen which reduces the number of active atomic or molecular nitrogen species available for reaction with the metal organic reagent.

For this reason it may be useful to construct the plasma tube from a material which has low inherent surface recombination properties for the particular active gas species being generated. Pyrolytic boron nitride (PBN) is a useful material for this purpose when generating a nitrogen plasma. However, PBN is a relatively expensive material and is difficult to machine to the desired specifications and so the cost of manufacture of the plasma generator is raised significantly by the inclusion of a PBN plasma tube. Further, the present inventors have noted that sputtering of the PBN tube walls introduces significant levels of boron as an impurity into the growing film. This reduces the quality of the film and its suitability for certain device purposes and is a significant drawback of this approach.

It would be useful to provide a plasma generator which allows for a reduction in the loss of active species due to surface recombinations but which does not contribute to impurity incorporation into the growing film beyond acceptable commercial levels.

SUMMARY OF INVENTION

According to a first aspect of the invention, there is provided a plasma generator comprising:
 (a) a plasma tube having a gas inlet formed in a first end of the plasma tube and a plasma outlet formed in a second end of the plasma tube;
 (b) an ionising source adjacent the plasma tube to define a first region of the plasma tube and to expose that region to an electromagnetic field to generate active plasma species; and
 (c) a pyrolytic boron nitride liner lining the inner walls of the plasma tube within a second region thereof,
wherein, the pyrolytic boron nitride liner does not extend into the first region beyond a distance which is greater than 20% of the length of the first region.

In one embodiment, the pyrolytic boron nitride liner does not extend into the first region beyond a distance which is greater than 10% of the length of the first region.

In a further embodiment, the pyrolytic boron nitride liner does not extend into the first region beyond a distance which is greater than 5% of the length of the first region.

In one embodiment, the pyrolytic boron nitride liner does not extend into the first region such that it does not line a portion of the inner surface of the plasma tube which is adjacent the ionising source.

In one embodiment, the gas inlet of the plasma tube or a portion of the plasma tube near the first end is constricted with respect to the remainder of the plasma tube.

Suitably, the constriction takes the form of a reduced diameter region of the gas inlet and/or at least a portion of the first region of the plasma tube with respect to the diameter of the second region of the plasma tube.

In one embodiment, the plasma generator is a component of an apparatus for forming a film. The apparatus may be for depositing a group Ill metal nitride film on a substrate. The apparatus may be an apparatus for forming a film employing a plasma as a reactant. In one embodiment, the apparatus is an RPCVD apparatus and so the plasma generator may be an RPCVD plasma generator.

Suitably, the apparatus may further comprise a growth chamber comprising a Group VA plasma inlet, a Group IIIA reagent inlet and a substrate holder adapted to support one or more substrates.

In one embodiment, the invention resides in an apparatus for depositing a group III metal nitride film on a substrate, the apparatus comprising:
 (a) a plasma generator to generate a nitrogen plasma from a nitrogen source the plasma generator comprising
  (i) a plasma tube having a gas inlet formed in a first end of the plasma tube and a plasma outlet formed in a second end of the plasma tube;
  (ii) an ionising source adjacent the plasma tube to define a first region of the plasma tube and to expose that region to an electromagnetic field to generate active plasma species;
  (iii) a pyrolytic boron nitride liner located adjacent the inner walls of the plasma tube within a second region thereof, the pyrolytic boron nitride liner not extending into the first region beyond a distance which is greater than 20% of the length of the first region;
 (b) a growth chamber in which to react a reagent comprising a group III metal with active nitrogen species derived from the nitrogen plasma so as to deposit a group III metal nitride on the substrate; and (c) a plasma inlet on the growth chamber to facilitate passage of nitrogen plasma from the plasma generator into the growth chamber.

In one embodiment, the apparatus is an RPCVD apparatus.

In one embodiment, a showerhead is located between the plasma generator and the growth chamber of the RPCVD apparatus.

In one embodiment, the pyrolytic boron nitride liner does not extend into the first region beyond a distance which is greater than 10% of the length of the first region.

In a further embodiment, the pyrolytic boron nitride liner does not extend into the first region beyond a distance which is greater than 5% of the length of the first region.

In one embodiment, the pyrolytic boron nitride liner does not extend into the first region such that it does not line a portion of the inner surface of the plasma tube which is adjacent the ionising source. When the pyrolytic boron nitride liner does not extend into the first region, the spacing between the pyrolytic boron nitride liner and the ionising source may be any distance as described previously for the plasma generator.

Suitably, the metal organic reagent is released into the growth chamber from the showerhead.

The showerhead may be provided with at least one aperture through its extent through which the plasma exiting the plasma outlet of the plasma tube can pass through to enter the growth chamber.

In one embodiment, the at least one aperture is provided with a pyrolytic boron nitride sheath or coating.

Preferably, the at least one aperture is a plurality of apertures and the majority of the apertures are provided with a pyrolytic boron nitride sheath. In one embodiment substantially all of the apertures are provided with a pyrolytic boron nitride sheath.

In one embodiment, a plasma cavity is defined by an upper surface of the showerhead, opposite the plasma outlet of the plasma generator, at least one side wall and a ceiling through which the plasma outlet of the plasma generator opens.

Suitably, the upper surface of the showerhead and the at least one side wall are covered with pyrolytic boron nitride.

In one embodiment, all surfaces of the plasma cavity are lined with one or more pyrolytic boron nitride liners which may be separate to or continuous with the pyrolytic boron nitride liner of the plasma generator.

According to a second aspect of the invention there is provided a method of generating a plasma including the steps of:

(a) providing a plasma generator comprising a plasma tube having a gas inlet formed in a first end of the plasma tube and a plasma outlet formed in a second end of the plasma tube, an ionising source adjacent the plasma tube to define a first region of the plasma tube and to expose that region to an electromagnetic field to generate active plasma species and a pyrolytic boron nitride liner located adjacent the inner walls of the plasma tube within a second region thereof, the pyrolytic boron nitride liner not extending into the first region beyond a distance which is greater than 20% of the length of the first region;

(b) supplying a feed gas through the gas inlet; and (c) exposing the gas to an electromagnetic field within the first region, to thereby generate a plasma.

The various components of the plasma generator may be as described in any embodiment of the first aspect, including the embodiment of an apparatus for depositing a group III metal nitride film on a substrate.

In a third aspect the invention resides in a group III metal film made by the process of the second aspect. The film may be a group III metal nitride film. In one embodiment, the film is a GaN film.

In a fourth aspect the invention resides in use of a group III metal film of the third aspect in a semiconductor device. The film may be as described for the third aspect.

The various features and embodiments of the present invention, referred to in individual sections above apply, as appropriate, to other sections, mutatis mutandis. Consequently features specified in one section may be combined with features specified in other sections as appropriate. Those conditions of pressure, gas flow and the nature of the various apparatus components described for the first aspect apply equally well to the second aspect and are considered to have been recited in full in relation to that aspect.

Further features and advantages of the present invention will become apparent from the following detailed description.

BRIEF DESCRIPTION OF THE DRAWINGS

In order that the invention may be readily understood and put into practical effect, preferred embodiments will now be described by way of example with reference to the accompanying figures wherein.

DETAILED DESCRIPTION OF THE DRAWINGS

The present invention is predicated, at least in part, on the finding that the undesirable incorporation of boron, as an impurity, into a film grown by RPCVD can be significantly reduced while still benefitting from the low surface recombination properties of a PBN liner in the plasma tube, which may also be referred to as the reaction tube, of the plasma generator if the liner is located such that it is not, to any great extent, within the region of the plasma tube which is surrounded by or immediately adjacent to the RF coils. Increasing distances of the RF coils from the PBN liner provide, up to a point, further gains in terms of boron impurity reduction.

In this patent specification, adjectives such as first and second, left and right, front and back, top and bottom, etc, are used solely to define one element or method step from another element or method step without necessarily requiring a specific relative position or sequence that is described by the adjectives. The terms 'comprises', 'comprising', 'includes', 'including', or similar terms are intended to mean a non-exclusive inclusion, such that a method, system or apparatus that comprises a list of elements does not include those elements solely, but may well include other elements not listed.

Unless defined otherwise, all technical and scientific terms used herein have the same meaning as would be commonly understood by those of ordinary skill in the art to which this invention belongs.

While the term "plasma" is used herein to discuss both the species formed by ionization of a gas within the plasma generating region and that which passes through the plasma tube, plasma cavity, showerhead and into the reaction or growth chamber of an RPCVD apparatus it will be appreciated that the charged gas species may be largely extinguished during this journey from plasma generating region to growth chamber and thus references to "plasma" in these regions will be understood as also referring to active gas species.

According to a first aspect of the invention, there is provided a plasma generator comprising:
  (a) a plasma tube having a gas inlet formed in a first end of the plasma tube and a plasma outlet formed in a second end of the plasma tube;
  (b) an ionising source adjacent the plasma tube to define a first region of the plasma tube and to expose that region to an electromagnetic field to generate active plasma species; and
  (c) a pyrolytic boron nitride liner lining the inner walls of the plasma tube within a second region thereof,
wherein, the pyrolytic boron nitride liner does not extend into the first region beyond a distance which is greater than 20% of the length of the first region.

By "the pyrolytic boron nitride liner does not extend into the first region beyond a distance which is greater than 20% of the length of the first region" it is intended that the PBN liner will largely reside in the second region but extends beyond that into the first region to be adjacent the ionising source in a limited extension region only. The extension distance into the first region in this embodiment is 20% of the length of the first region (the first region being the portion of the plasma tube having the ionising source immediately adjacent thereto) wherein the length is measured in the direction of travel of gas/plasma species through the plasma tube in operation. If the ionising source in its entirety is adjacent the plasma tube then the length of the first region will be the same as the length of the ionising source, such as RF coils. By way of example only, if the length of the first region in the direction of gas/plasma species travel is 5 cm then the pyrolytic boron nitride liner will not extend into the first region to overlap with the ionising source by any more than 10 mm, that distance being 20% of 5 cm.

While it is preferred, for optimal results, that there is no overlap between the PBN liner and the ionising source the inventors have found that recombination of energetic gas species can be reduced significantly while boron impurities may be kept at manageable levels when a relatively small overlap, such as 20% or less, as defined above, is present.

In one embodiment, the pyrolytic boron nitride liner does not extend into the first region beyond a distance which is greater than 10% of the length of the first region.

In a further embodiment, the pyrolytic boron nitride liner does not extend into the first region beyond a distance which is greater than 5% of the length of the first region.

In one embodiment, the pyrolytic boron nitride liner does not extend into the first region such that it does not line a portion of the inner surface of the plasma tube which is adjacent the ionising source. This is a preferred embodiment wherein the PBN liner and ionising source do not overlap or to put it another way, wherein a spacing between the PBN liner and the ionising source is maintained.

Reference to the PBN liner not lining the inner surface of the plasma tube which is 'adjacent' the ionising source means that the PBN liner and the RF coils do not, at any point, overlap along the axis of length of the plasma tube which may also be defined as the direction of travel of gas/plasma through the plasma tube.

In one embodiment, the pyrolytic boron nitride liner begins at a distance greater than 0 mm to approximately 100 mm from a lower end of the ionising source. The lower end of the ionising source can be defined as the point or surface of the ionising source which is closest to the PBN liner. For example, when the ionising source is RF coils then the distance the PBN liner begins from this source is measured from the underside of the lowest coil being that closest to the PBN liner. Alternatively, but with the same effect achieved, the lower end of the ionising source can be defined as the level of the last point of the ionising source which the travelling gas or plasma will, in operation, pass by in its direction of travel prior to exiting the plasma tube. The spacing referred to in the following paragraphs relates to the distance between this point and the first point of the PBN liner which the plasma encounters on its direction of travel, in operation, In one embodiment, wherein the pyrolytic boron nitride liner does not extend into the first region, the spacing between the pyrolytic boron nitride liner and the ionising source is between greater than 0 mm to approximately 100 mm. Preferably, the spacing between the pyrolytic boron nitride liner and the ionising source is between about 5 to about 100 mm. In one embodiment, the spacing between the pyrolytic boron nitride liner and the ionising source is between about 10 to 75 mm. In a further embodiment, the spacing between the pyrolytic boron nitride liner and the ionising source is between about 15 to 50 mm. In yet a further embodiment, the spacing between the pyrolytic boron nitride liner and the ionising source is between about 20 to about 30 mm. These ranges include and may be selected from the group consisting of greater than 0 mm to 100 mm, greater than 0 mm to 90 mm, greater than 0 mm to 80 mm, greater than 0 mm to 70 mm, greater than 0 mm to 60 mm, greater than 0 mm to 50 mm, greater than 0 mm to 40 mm and greater than 0 mm to 30 mm, 1 to 100 mm, 1 to 90 mm, 1 to 80 mm, 1 to 70 mm, 1 to 60 mm, 1 to 50 mm, 1 to 40 mm and 1 to 30 mm, 2 to 100 mm, 2 to 90 mm, 2 to 80 mm, 2 to 70 mm, 2 to 60 mm, 2 to 50 mm, 2 to 40 mm and 2 to 30 mm, 5 to 100 mm, 5 to 90 mm, 5 to 80 mm, 5 to 70 mm, 5 to 60 mm, 5 to 50 mm, 5 to 40 mm and 5 to 30 mm, 10 to 100 mm, 10 to 90 mm, 10 to 80 mm, 10 to 70 mm, 10 to 60 mm, 10 to 50 mm, 10 to 40 mm and 10 to 30 mm, 20 to 100 mm, 20 to 90 mm, 20 to 80 mm, 20 to 70 mm, 20 to 60 mm, 20 to 50 mm, 20 to 40 mm and 20 to 30 mm, 30 to 100 mm, 30 to 90 mm, 30 to 80 mm, 30 to 70 mm and 30 to 60 mm, 40 to 100 mm, 40 to 90 mm, 40 to 80 mm, 40 to 70 mm and 40 to 60 mm as well as individual values of about 10 mm, 20 mm, 30, mm, 40 mm, 50 mm, 60 mm, 70 mm, 80, mm, 90 mm and 100 mm.

The PBN liner may extend from the point defined above to be substantially adjacent the plasma outlet or to end at any point in between, The present inventors have found that the maintenance of a separation, such as is described above, between the lower end of the ionising source and the beginning of the PBN liner provides significant lowering of the levels of boron which are incorporated into the growing film(s) while surprisingly providing for a useful reduction in recombinations of energetic species. Without wishing to be bound by any particular theory it is postulated that, while it is believed that ejection of boron atoms from PBN liners occurs due to sputtering or etching upon contact with active plasma species, such as active nitrogen plasma species, the extent of this sputtering or etching is greatly increased directly in the plasma forming region encompassed by the ionising source. Thus, lowering of the PBN liner away from this region, or indeed raising of the ionising source to be located further above the PBN liner, results in less boron being ejected from the liner. The location of the PBN liner separate to the region of the plasma tube encompassed by the ionising source would, based on the understanding in the art, be expected to decrease film quality due to an increase in the number of surface recombinations of the active nitrogen species occurring on the non-PBN liner portion of the plasma tube but surprisingly it has been found that films of high quality can still be formed under the same process conditions as with a PBN liner which covers the entire plasma tube or at least is present adjacent the ionising source, that is, without the need to increase gas flow rate or ionising source power to compensate for any loss in active plasma species. References herein to a "partial PBN liner" will be understood to refer to an arrangement whereby such a separation between the liner and ionising source is used.

Preferably, the pyrolytic boron nitride liner is a removable liner. The ability to remove the liner and replace it with a new PBN liner has significant advantages in operation. Firstly, it provides flexibility in that process runs can be carried out without the use of a liner for the sake of comparison or if a substantially boron free film is desired. Secondly, when an existing PBN liner becomes worn or damaged it can be easily replaced with minimal downtime and avoiding the expense of replacing the entire plasma tube as would be required if the PBN was a permanent coating.

Suitably, the pyrolytic boron nitride liner is of a thickness in the range 0.6 mm to 1.3 mm. Preferably, the pyrolytic boron nitride liner is of a thickness in the range 0.7 mm to 1.1 mm. Even more preferably, the pyrolytic boron nitride liner is of a thickness in the range 0.75 mm to 0.9 mm, for example about 0.8 mm.

These ranges include 0.6 mm to 1.2 mm, 0.6 to 1.1 mm, 0.6 to 1.0 mm, 0.6 mm to 0.9 mm and 0.6 to 0.8 mm, 0.7 mm to 1.2 mm, 0.7 to 1.1 mm, 0.7 to 1.0 mm, 0.7 mm to 0.9 mm and 0.7 to 0.85 mm as well as individual values of about 0.6 mm, 0.7 mm, 0.8 mm, 0.9 mm, 1.0 mm. 1.1 mm, 1.2 mm and 1.3 mm.

In certain embodiments, the plasma tube is formed from a material selected from the group consisting of aluminium nitride, quartz and alumina. This material also forms the inner surface of the first region of the plasma tube against which the PBN liner will sit. This means that the region of the plasma tube adjacent the ionising source, referred to herein as the first region, will have an inner surface which is formed from these materials rather than PBN and so the plasma will have collisions with one of these materials when colliding with the inner surface. In the second region of the plasma tube, being that region of the plasma tube having the PBN liner located adjacent its inner wall(s)/surface, the plasma active species will, when colliding with the inner surface of the plasma tube, collide with PBN thereby reducing the incidence of surface recombinations and hence loss of active plasma species.

In preferred embodiments, the ionising source is a radio frequency (RF) source or a microwave source.

Preferably, the ionising source is in the form of an RF coil. While other ionising sources will be known to those skilled in the art further references herein, and in particular in relation to the figures and examples, will be to an RF coil as the ionising source. The skilled addressee, in light of the teaching herein, would be able to apply the present invention with standard modifications only to incorporate other ionising sources.

In one embodiment, the plasma generator is an RPCVD plasma generator. RPCVD requires growth conditions which are significantly different to those needed in alternative growth processes and which can influence the plasma generation process. For example, MBE growth conditions are very different to those of RPCVD particularly in terms of the growth pressure and gas flows. MBE growth is performed at much lower growth pressures (less than 1E-4 Torr) and uses a relatively low plasma gas flow (~a few sccm) whereas RPCVD operates at much higher pressure (~a few Torr) and uses much higher gas flows (few hundred to few thousand sccm). Because of these differences, RPCVD growth process, chamber parts, plasma generation and its delivery cannot be directly compared with those of MBE.

In one embodiment, the invention resides in an apparatus for depositing a group III metal nitride film on a substrate, the apparatus comprising:

(a) a plasma generator to generate a nitrogen plasma from a nitrogen source the plasma generator comprising
  (i) a plasma tube having a gas inlet formed in a first end of the plasma tube and a plasma outlet formed in a second end of the plasma tube;
  (ii) an ionising source adjacent the plasma tube to define a first region of the plasma tube and to expose that region to an electromagnetic field to generate active plasma species;
  (iii) a pyrolytic boron nitride liner located adjacent the inner walls of the plasma tube within a second region thereof, the pyrolytic boron nitride liner not extending into the first region beyond a distance which is greater than 20% of the length of the first region;

(b) a growth chamber in which to react a reagent comprising a group III metal with active nitrogen species derived from the nitrogen plasma so as to deposit a group III metal nitride on the substrate; and (c) a plasma inlet on the growth chamber 520 to facilitate passage of nitrogen plasma from the plasma generator into the growth chamber.

In one embodiment, the apparatus is an RPCVD apparatus.

Suitably, the growth chamber comprises a Group VA plasma inlet, a Group IIIA reagent inlet and a substrate holder adapted to support one or more substrates. Preferably, the gas is nitrogen and so the Group VA plasma is a nitrogen plasma comprising active nitrogen species. Suitably, the plasma tube gas inlet is a nitrogen gas inlet and the plasma outlet is a nitrogen plasma outlet.

Suitably, the Group IIIA reagent is a Group IIIA metal organic reagent The reagents which may be employed with the present apparatus and method, and hence the nature of the films which can be formed, are not particularly limited. Although the embodiments discussed herein generally employ a nitrogen plasma and a metal organic (typically a gallium containing metal organic such as trimethylgallium or triethylgallium) as the reagents, the utility of the present invention is not so limited.

Further references herein to the gas flow and plasma will refer to nitrogen and references to the metal organic reagent will be to trimethylgallium (TMG) or triethylgallium (TEG) thereby resulting in GaN films.

In one embodiment, the growth pressure in the growth chamber is between about 1 to about 10 Torr, preferably between about 1.5 to about 6 Torr, more preferably between about 2 to about 5 Torr, for example about 2.5, 3.0, 3.5 or 4.0 Torr.

The ranges presented include 1 to 9 Torr, 1 to 8 Torr, 1 to 7 Torr, 1 to 6 Torr, 1 to 5 Torr and 1 to 4 Torr, 2 to 9 Torr, 2 to 8 Torr, 2 to 7 Torr, 2 to 6 Torr, 2 to 5 Torr and 2 to 4 Torr.

The rate of flow of gas through the gas inlet, to be converted to plasma, will increase with increasing deposition area or increasing numbers of substrates. Suitable exemplary flow rates may be between about 50 sccm to about 5000 sccm, preferably between about 500 sccm to about 4000 sccm, more preferably between about 1000 sccm to about 3000 sccm, for example about 2500 sccm. It will, however, be appreciated by those skilled in the art that the exact flow rate required will depend upon a number of factors such as the size of the growth chamber, the deposition area and the number of substrate wafers on which film growth is being carried out. For example, assuming similar chamber configurations (I.e. chamber height, geometry, etc.), if the number of wafers or the growth area is doubled then the flow should also approximately double for a fixed growth rate and similar film properties. The flow ranges described above may be suitable for an apparatus employing, for example, seven 2-inch wafers upon which film deposition is to occur.

Figure 1:
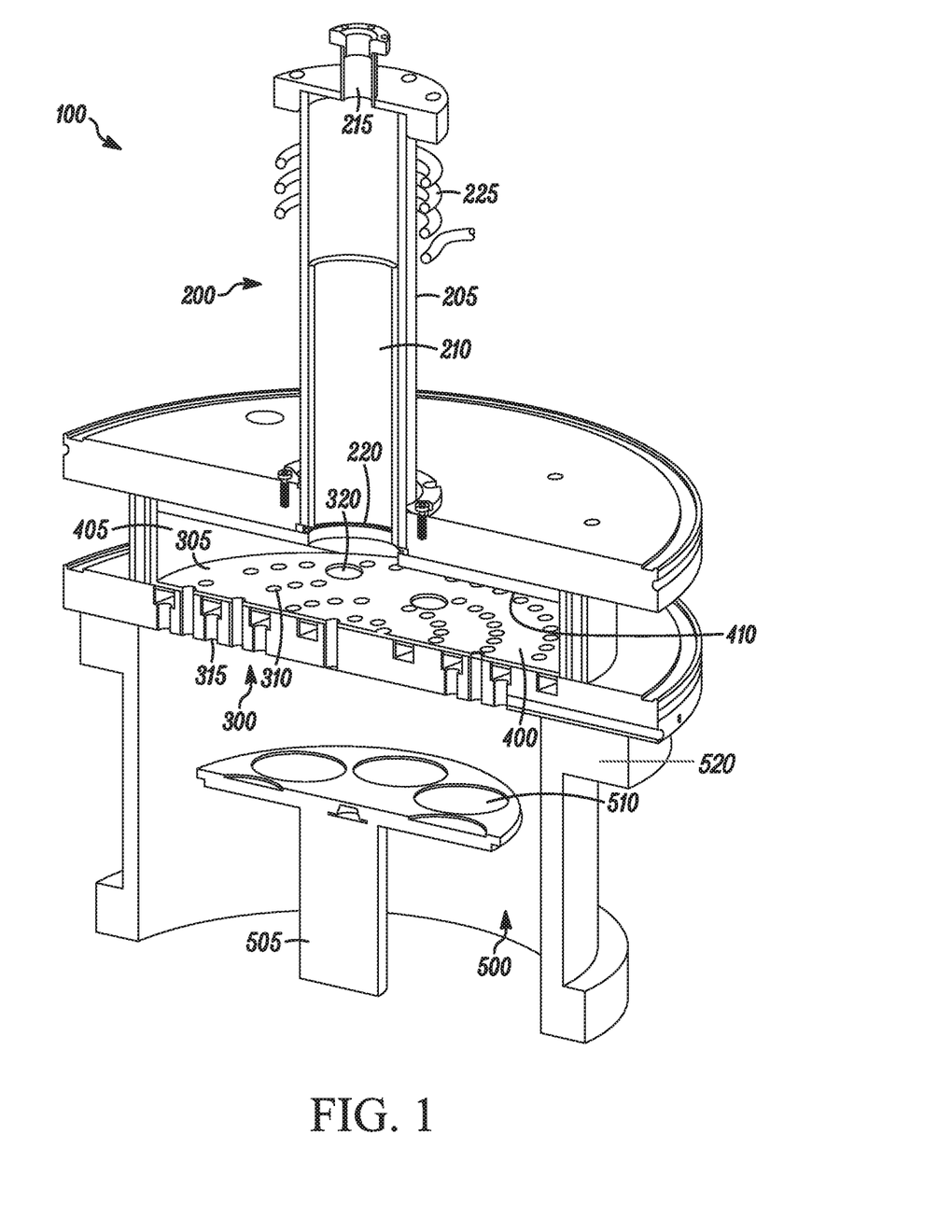
FIG. 1 shows a perspective sectional view of one embodiment of an apparatus for depositing a metal nitride film on a substrate when employing a plasma tube with a partial PBN liner.

FIG. 1 shows a perspective sectional view of one embodiment of an apparatus for depositing a metal nitride film on a substrate when employing a plasma tube with a partial PBN liner, The apparatus 100 is an RPCVD apparatus and comprises plasma generator 200, showerhead 300, plasma cavity 400 and growth chamber 500. The plasma generator 200 comprises a plasma tube 205 which is cylindrical in the embodiment shown. The plasma tube 205 is preferably constructed from aluminium nitride while quartz and alumina would also be suitable. The plasma tube 205 has, adjacent a portion of its inner surface referred to herein as a second region, a PBN liner 210. The plasma tube is capped at its upper extent forming a first end into which a gas inlet 215 opens. Although not shown in the figures gas inlet 215 will be connected to a gas supply such as a nitrogen supply. At the lower extent or second end of plasma tube 205 there is a plasma outlet 220 which, in the embodiment shown, is simply an open end of the plasma tube 205 but may take a number of forms such as a constricted region or partial filter to focus and control exiting plasma species. Such plasma outlet designs are known in the art. A portion of the plasma tube 205, referred to herein as the first region, is immediately adjacent or encompassed by RF coils 225 to expose that region to an electromagnetic field and forms the plasma generating zone. It will be appreciated that the PBN liner 210 does not extend into the first region such that it does not line a portion of the inner surface of the plasma tube 205 which is vertically aligned or immediately adjacent the RF coils 225. That is, there is a vertical spatial separation between the lower end 230 of the RF coils 225 and the beginning of the PBN liner 210. It is this separation of these two components, and these two relative positions or points, which provides the advantages discussed herein of good quality film production with reduced boron incorporation. It will be appreciated that in all cases the separation may not be a vertical separation, that is, the plasma tube may sit horizontally within the correct apparatus but the principle of the separation remains.

The showerhead 300 has an upper surface 305 which is provided with a series of apertures. A plurality of plasma apertures 310 are shown which allow the passage of active nitrogen plasma from the plasma outlet 220 through the plasma cavity to enter the growth chamber 500.

In one embodiment, the plasma apertures 310 are provided with a pyrolytic boron nitride sheath or coating. Preferably, the majority, more preferably substantially all, of the plasma apertures 310 are provided with a pyrolytic boron nitride sheath. This PBN sheath will assist in reducing the number of surface recombinations of active nitrogen atoms which occur during passage through the showerhead 300.

The showerhead 300 is provided with metal organic delivery channels 315 within its interior. These channels 315 open, at a plurality of points formed in the underside of the showerhead 300, into the growth chamber 500 for delivery therein of the Trimethylgallium (TMG) or Triethylgallium (TEG). Additional apertures 320 are formed in the upper surface of the showerhead 300 and pass through its extent. These combined with view ports on the top plasma cavity ceiling 410 allow the operation of in-situ analysis equipment, such as a pyrometer to monitor temperature or filmetrics to monitor film thickness, through the showerhead 300 and into the growth chamber 500.

In one embodiment, the plasma cavity 400, which will comprise active gas species in use, is defined by an upper surface of the showerhead 300, opposite to the plasma outlet of the plasma generator, at least one wall or side wall 405 and a ceiling 410 through which the plasma outlet 220 of the plasma generator 200 opens. Suitably, the upper surface 305 of the showerhead 300 and the at least one side wall 405 are covered with pyrolytic boron nitride. In one embodiment, all surfaces of the plasma cavity 400 are coated or covered with aluminium or PBN which may be separate to or continuous with the PBN liner 210 of the plasma generator 200. In addition to aluminium and PBN, other materials with an ability to reduce surface recombinations of active plasma species may also be selected for coating or covering the surfaces mentioned above.

Growth chamber 500 is of a standard design which is well known in the art. It comprises a substrate holder 505 on which a number of substrates 510 are located. The substrate holder 505 may be of a turn table design and so may be rotating at high speed throughout the deposition process. Waste is removed via an outlet (not shown in the figures).

Figure 2:
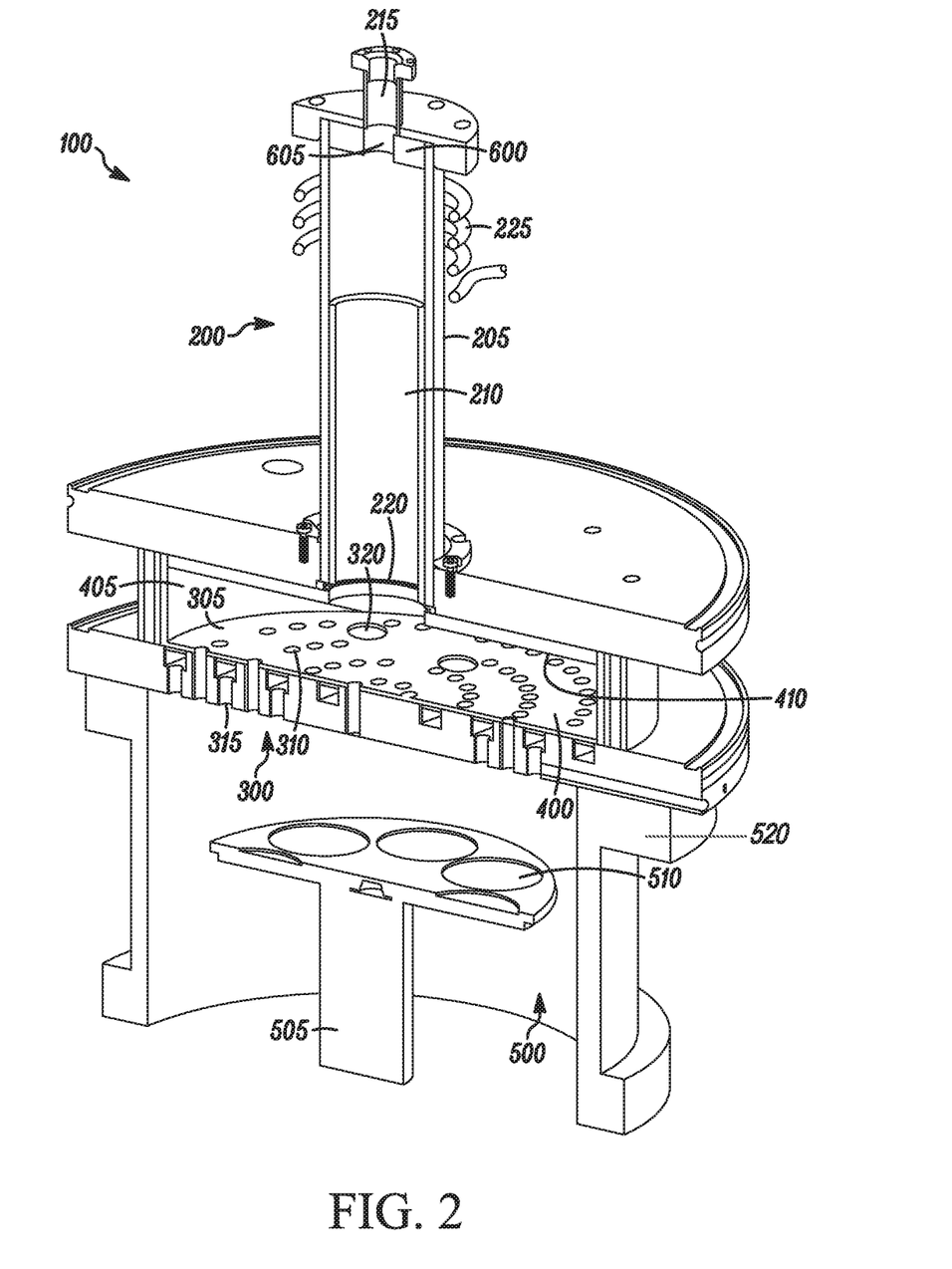
FIG. 2 is a perspective sectional view of the apparatus for depositing a metal nitride film on a substrate of FIG. 1 but employing a constricted gas inlet.

FIG. 2 is a perspective sectional view of the apparatus for depositing a metal nitride film on a substrate of FIG. 1 but employing a constricted gas inlet 215 or extension thereof. The embodiment of FIG. 2 is substantially similar to that of FIG. 1 with one additional component and so only the relevant parts are discussed below. However, it will be understood that all comments made in relation to FIG. 1 apply equally well to FIG. 2.

In the embodiment shown, the gas inlet 215 of the plasma tube or a portion of the plasma tube 205 near the first end is constricted with respect to the remainder of the plasma tube 205. In the embodiment shown in FIG. 2 an insert 600 is located in the upper extent of the plasma tube 205 and is provided with an aperture 605 through its extent which, in use, is aligned with the gas inlet 215. This will result in a restricted gas flow being introduced into the first region of the plasma tube 205 adjacent the RF coils 225 for plasma generation. Due to the velocity of the gas and the geometry forced upon the flow path the gas will pass through the first region of the plasma tube 205 with minimal contact with the walls of the plasma tube 205. This is a particularly advantageous embodiment as any loss of active nitrogen atoms due to recombination with the walls of the plasma tube 205 in the first region, where no PBN liner is available to reduce this mechanism, is greatly minimised by flow control to prevent the surface collisions from happening. The reduced surface collision may also reduce the boron sputtering effects in the PBN liner and thereby may lead to a reduction in boron impurity in GaN films grown using this constricted geometry. Thus, the constriction of the first end is a mechanism which may work in concert with the partial PBN liner described herein to produce an optimal result.

As discussed, suitably the constriction takes the form of a reduced diameter region of the gas inlet 215 or plasma tube 205 with respect to the diameter of the second region of the plasma tube 205. It will be appreciated, however, that any means of constricting the gas flow through the plasma generating zone relative to its allowed flow capacity in the second region may achieve the same affect.

According to a second aspect of the invention there is provided a method of generating a plasma including the steps of:
(a) providing a plasma generator comprising a plasma tube having a gas inlet formed in a first end of the plasma tube and a plasma outlet formed in a second end of the plasma tube, an ionising source adjacent the plasma tube to define a first region of the plasma tube and to expose that region to an electromagnetic field to generate active plasma species and a pyrolytic boron nitride liner located adjacent the inner walls of the plasma tube within a second region thereof, the pyrolytic boron nitride liner not extending into the first region beyond a distance which is greater than 20% of the length of the first region;
(b) supplying a feed gas through the gas inlet; and
(c) exposing the gas to an electromagnetic field within the first region,
to thereby generate a plasma.

In one embodiment the gas is selected from the group consisting of nitrogen, hydrogen, ammonia, helium or any inert gas. Preferably, the gas is nitrogen.

The method is carried out using the plasma generator as described in relation to the first aspect and FIGS. 1 and 2. Thus all of the process conditions and apparatus and plasma generator components set out for the first aspect apply equally well to the second aspect and are to be taken as described in respect to same in full.

EXPERIMENTAL

General

In the following experiments three different PBN liner arrangements were employed in which to grow GaN films under RPCVD conditions. The exact same process conditions were used in each case and so the only variable was the positioning and relative length of the PBN liner.

Process Conditions

RPCVD films were grown at 3.5 Torr with a metal organic injector flow of 1600 sccm hydrogen. Triethylgallium (TEG) was used as the metal organic reagent at a flow of 120 sccm. The plasma nitrogen flow was 2500 sccm. The plasma was generated using a 2.0 kW RF source operating at 13.56 MHz. The growth was carried out without any showerhead between the plasma source and the wafers. The resulting growth rate was 0.6 μm/hour.

Figure 3:
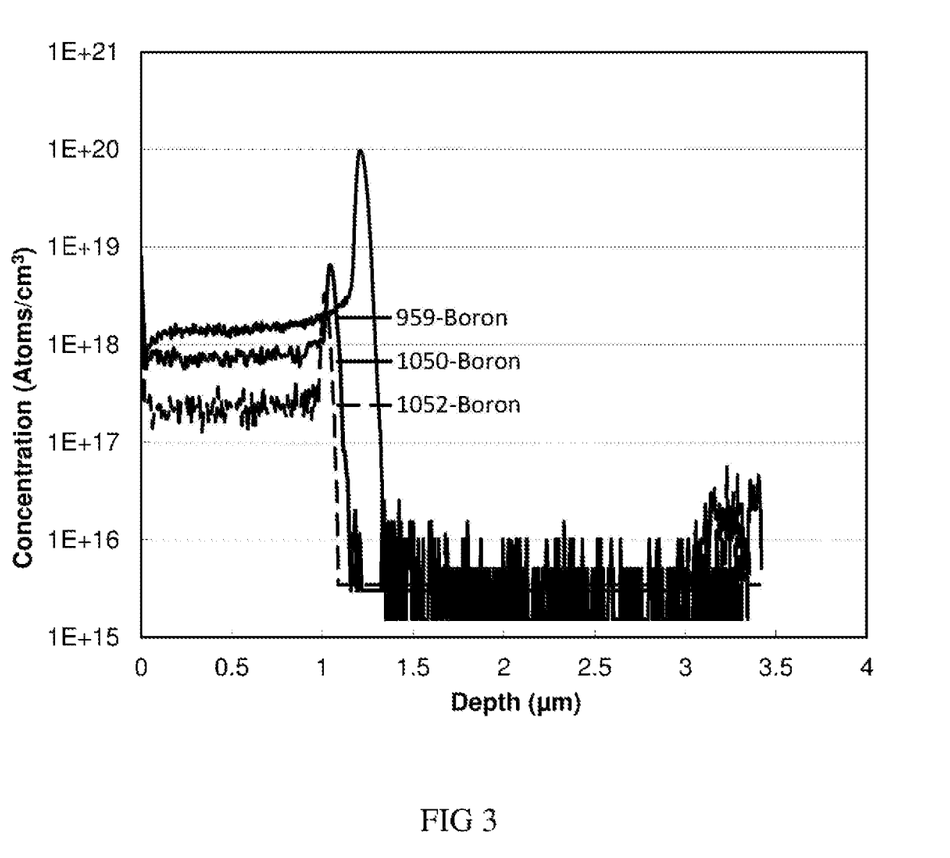
FIG. 3 is a SIMS graphical analysis of the level of boron, as an impurity, found in GaN films produced with a full PBN liner, a partial PBN liner spaced 10 mm from the RF coil and a partial PBN liner spaced 20 mm from the RF coil.

For the experimental runs, one run was performed using a full standard PBN liner which covered the entire length of the AlN plasma tube (labelled run '959 Boron' in FIG. 3). A further experiment employed a partial PBN liner with the distance between the underside or lower end of the RF coil and the top or beginning of the PBN liner set at 10 mm (labelled run '1050 Boron' in FIG. 3). Finally, an experiment was also performed using the partial PBN liner but with the distance between the lower extent of the RF coil and the point of the PBN liner nearest that lower extent set at 20 mm. This was achieved by taking the RF coil in run 1050 and raising it a further 10 mm relative to the PBN liner. This experimental run was labelled run '1052 Boron' in FIG. 3.

Results

FIG. 3 is a SIMS graphical analysis of the level of boron, as an impurity, found in GaN films produced by the three experimental conditions in terms of PBN length and relative positioning to the end of the RF coil, as described above. It can be clearly seen that the concentration of boron atoms in the GaN films grown using the apparatus and method of the present invention, i.e. with the lower end of the RF coils increasingly spaced apart from a partial PBN liner, are significantly less than that found in the GaN film grown under exactly the same conditions but with a full PBN liner covering all of the inner surface of the plasma tube.

Specifically, the run using a full PBN liner (uppermost line in FIG. 3 at 0.5 μm depth) resulted in a GaN film containing significantly greater levels of boron impurities than the other two runs. This difference in purity levels will influence the film quality with boron reduction a desirable outcome. Run 1052 employing a 20 mm spacing between PBN liner and RF coils showed lower levels of boron, as an impurity, in the final film relative to run 1050 having a 10 mm spacing. Therefore, up to a point, increasing spacing between liner and coils is desirable. Both films employing the partial PBN liner (runs 1050 and 1052) were otherwise of a high quality and suitable for use in typical GaN film applications.

This SIMS analysis indicates that separating the PBN liner from the ionising source, as described before and shown in FIGS. 1 and 2, provides for a surprising level of reduction in the levels of boron incorporated into the grown films. As boron impurities can negatively impact upon film quality, and hence performance, this level of control is highly desirable for films of extremely high quality.

The above description of various embodiments of the present invention is provided for purposes of description to one of ordinary skill in the related art. It is not intended to be exhaustive or to limit the invention to a single disclosed embodiment. As mentioned above, numerous alternatives and variations to the present invention will be apparent to those skilled in the art of the above teaching. This patent specification is intended to embrace all alternatives, modifications and variations of the present invention.

The invention claimed is:
1. A plasma generator comprising:
(a) a plasma tube having a gas inlet formed in a first end of the plasma tube and a plasma outlet formed in a second end of the plasma tube;
(b) an ionising source, in the form of an RF coil, adjacent the plasma tube and thereby defining a first region thereof, and to expose that first region to an electromagnetic field to generate active plasma species, the first region beginning adjacent the first end of the plasma tube; and
(c) an exposed pyrolytic boron nitride liner lining the inner walls of the plasma tube within a second region thereof, the second region being between the first region and the second end of the plasma tube; and wherein the pyrolytic boron nitride liner is spaced from a lowermost extent of the ionising source closest to the plasma outlet, by a distance of 10-75 mm.

2. The plasma generator of claim 1 wherein the pyrolytic boron nitride liner is a removable liner.

3. The plasma generator of claim 1 wherein the plasma generator is an RPCVD plasma generator.

4. The plasma generator of claim 1 wherein the gas inlet is a nitrogen gas inlet.

5. The plasma generator of claim 1 wherein the gas inlet of the plasma tube or a portion of the plasma tube near the first end is constricted with respect to the remainder of the plasma tube.

6. The plasma generator of claim 5 wherein the constriction takes the form of a reduced diameter region of the gas inlet and/or at least a portion of the first region of the plasma tube with respect to the diameter of the second region of the plasma tube.

7. An apparatus for depositing a group III metal nitride film on a substrate, the apparatus comprising:
(a) a plasma generator to generate a nitrogen plasma from a nitrogen source the plasma generator comprising:
(i) a plasma tube having a gas inlet formed in a first end of the plasma tube and a plasma outlet formed in a second end of the plasma tube;
(ii) an ionising source adjacent the plasma tube and thereby defining a first region thereof, and to expose that first region to an electromagnetic field to generate active plasma species, the first region beginning adjacent the first end of the plasma tube;
(iii) an exposed pyrolytic boron nitride liner located adjacent the inner walls of the plasma tube within a second region thereof, the second region being between the first region and the second end of the plasma tube, wherein the pyrolytic boron nitride liner is spaced from a lowermost extent of the ionising source closest to the plasma outlet, by a distance of 10-75 mm;
(b) a growth chamber in which to react a reagent comprising a group III metal with active nitrogen species derived from the nitrogen plasma so as to deposit a group III metal nitride on the substrate; and
(c) a plasma inlet on the growth chamber to facilitate passage of nitrogen plasma from the plasma generator into the growth chamber.

8. The apparatus of claim 7 wherein the apparatus is an RPCVD apparatus.

9. The apparatus of claim 7 further comprising a showerhead located between the plasma generator and the growth chamber.

10. The apparatus of claim 9 wherein the showerhead comprises at least one aperture passing through its extent through which the plasma exiting the plasma outlet of the plasma tube can pass through to enter the growth chamber, the at least one aperture being provided with a pyrolytic boron nitride sheath or coating.

11. The apparatus of claim 10 wherein the at least one aperture is a plurality of apertures the majority of which are provided with a pyrolytic boron nitride sheath.

12. The apparatus of claim 7 further comprising a plasma cavity defined by an upper surface of the showerhead, opposite the plasma outlet of the plasma generator, at least one side wall and a ceiling through which the plasma outlet of the plasma generator opens.

13. The apparatus of claim 12 wherein at least the upper surface of the showerhead and the at least one side wall are lined with pyrolytic boron nitride.

14. A method of generating a plasma including the steps of:
(a) providing a plasma generator comprising a plasma tube having a gas inlet formed in a first end of the plasma tube and a plasma outlet formed in a second end of the plasma tube, an ionizing source, in the form of an RF coil, adjacent the plasma tube and thereby defining a first region thereof, and to expose that first region to an electromagnetic field to generate active plasma species, the first region beginning adjacent the first end of the plasma tube, and an exposed pyrolytic boron nitride liner lining the inner walls of the plasma tube within a second region thereof, the second region being between the first region and the second end of the plasma tube, wherein the pyrolytic boron nitride liner is spaced from a lowermost extent of the ionising source closest to the plasma outlet, by a distance of 10-75 mm;
(b) supplying a feed gas through the gas inlet; and
(c) exposing the gas to an electromagnetic field within the first region, to thereby generate a plasma.

15. The method of claim 14 wherein the growth pressure in the growth chamber is between about 1 to about 10 Torr.

16. A plasma generator comprising:
(a) a cylindrical plasma tube having a gas inlet formed in a first end of the cylindrical plasma tube and a plasma outlet formed in a second end of the cylindrical plasma tube;
(b) an ionising source, in the form of an RF coil, adjacent the cylindrical plasma tube and thereby defining a first cylindrical region thereof, and to expose that first cylindrical region to an electromagnetic field to generate active plasma species, the first cylindrical region beginning adjacent the first end of the cylindrical plasma tube; and
(c) an exposed pyrolytic boron nitride liner lining the inner walls of the cylindrical plasma tube within a second cylindrical region thereof, the exposed pyrolytic boron nitride liner having a diameter substantially conforming to an inner diameter of the cylindrical plasma tube, the second cylindrical region being between the first cylindrical region and the second end of the cylindrical plasma tube, wherein:
the pyrolytic boron nitride liner is spaced from a lowermost extent of the ionising source closest to the plasma outlet, by a distance of 10-75 mm; and
the cylindrical plasma tube is cylindrical along its length between the first end and second end.

17. The plasma generator of claim 1, wherein the pyrolytic boron nitride liner is spaced from a lowermost extent of the ionising source closest to the plasma outlet, by a distance selected from: 10-70 mm, 10-60 mm, 10-50 mm, 10-40 mm, 10-30 mm, 10 mm and 20 mm.

18. The apparatus of claim 7, wherein the pyrolytic boron nitride liner is spaced from a lowermost extent of the ionising source closest to the plasma outlet, by a distance selected from: 10-70 mm, 10-60 mm, 10-50 mm, 10-40 mm, 10-30 mm, 10 mm and 20 mm.

19. The method of claim 14, wherein the pyrolytic boron nitride liner is spaced from a lowermost extent of the ionising source closest to the plasma outlet, by a distance selected from: 10-70 mm, 10-60 mm, 10-50 mm, 10-40 mm, 10-30 mm, 10 mm and 20 mm.

20. The plasma generator of claim 16, wherein the pyrolytic boron nitride liner is spaced from a lowermost extent of the ionising source closest to the plasma outlet, by a distance selected from: 10-70 mm, 10-60 mm, 10-50 mm, 10-40 mm, 10-30 mm, 10 mm and 20 mm.

* * * * *